United States Patent [19]
Lee et al.

[11] Patent Number: 6,150,892
[45] Date of Patent: Nov. 21, 2000

[54] METHOD AND DEVICE FOR DIGITALLY SYNTHESIZING FREQUENCY

[75] Inventors: Chen-Yi Lee, Hsinchu; Terng-Yin Hsu, Taipei Hsien; Bai-Jue Shieh, Taipei; Chung Cheng Wang, Taipei Hsien, all of Taiwan

[73] Assignee: TFL Lan Inc., Taipei, Taiwan

[21] Appl. No.: 09/182,236

[22] Filed: Oct. 30, 1998

[30] Foreign Application Priority Data

Oct. 7, 1998 [TW] Taiwan ................................. 87116595

[51] Int. Cl.⁷ .............................. H03L 7/00; H03L 7/099
[52] U.S. Cl. .................................. 331/46; 331/2; 331/4; 331/48; 331/57; 331/1 R; 327/156; 327/107
[58] Field of Search ............................... 331/57, 2, 4, 46, 331/48, 1 A, 1 R; 327/156, 107

*Primary Examiner*—Arnold Kinkead
*Attorney, Agent, or Firm*—Dougherty & Troxell

[57] ABSTRACT

A method and device for frequency synthesizing, in which the digital frequency synthesizer includes a clock pair having two similar ring-oscillators to separately generate a search frequency and an output frequency, a frequency tracking unit, and a clock controlling unit. The frequency-search method includes two stages: one stage is the coarse search stage based on the "Prune-and-Search", and other stage is the fine search stage based on the "fixed-step" algorithm. In order to determine which search scheme is used to search the target frequency and to determine the lock status, two cost functions for search and lock-in are derived. These two cost functions define the search threshold and the lock threshold, and these thresholds define the cost window and the lock window. If the frequency error is higher than both the search and lock thresholds, a coarse search is activated to estimate the correct frequency. And only when the frequency error falls between the search and the lock thresholds, should the fine search be activated. By properly assigning these two thresholds, the search performance, such as tinting and frequency error, and the output resolution can be improved. The digital frequency synthesizer which can be designed at HDL level and synthesized as part of a target cell library.

7 Claims, 5 Drawing Sheets

METHOD AND DEVICE FOR DIGITALLY SYNTHESIZING FREQUENCY

BACKGROUND OF THE INVENTION

The present invention is, in general, related to a method and device for frequency synthesizing and, more specifically, to a method and device for synthesizing frequency using a digital approach. In particular, the present invention is related to a frequency synthesizer which can be designed at Hardware Description Language (HDL) level and synthesized for a target cell library, and it can also be integrated with other modules to become a multi-functional IP-based on-chip device.

As more applications such as multimedia, digital communication and microprocessors are adopting the system-on-chip (SOC) approach, it is necessary to provide an on-chip frequency synthesizer to meet the system requirements in those SOC applications. The key features of a frequency synthesizer, in general, include the pulling range, the lock-in time, resolution and stability. In the past, frequency synthesizers based on PLL/DPLL designs have been developed. The prior art synthesizer designs can be found in I. Novof, et al., "Fully-Integrated CMOS Phase-Locked Loop with 15 to 240 MHz Locking Range and ±50 ps Jitter," *IEEE International Solid-State Circuits Conference*, pp. 112–114, 1995, and C. K. Yang, et al., "A Low Jitter 0.3–165 MHz CMOS PLL Frequency Synthesizer for 3V/5V Operation," *IEEE J. Solid-State Circuits*, vol. 32, no. 4, pp. 582–586, April, 1997. Very often, the prior art frequency synthesizers are designed using an analog approach. As a result, the design cycle cannot be reduced, and the final solution remains technology dependent. As VLSI technology advances, it is possible to provide a true digital frequency synthesizer to include the above-mentioned features.

SUMMARY OF THE INVENTION

It is an objective of the present invention to provide a method and device for frequency synthesizing using a digital approach. It is another objective of the present invention to provide a digital frequency synthesizer which can be designed at HDL level and synthesized as part of a target cell library. In other words, the digital frequency synthesizer can be of an IP-based on-chip design and can be integrated with other modules to reduce SOC turnaround time.

To achieve these and other objectives, the present invention uses two similar ring-oscillators to separately generate a search frequency and an output frequency; a first divider for generating a reference frequency; a second divider for outputting an adjusted search frequency; a frequency tracking unit for comparing the adjusted searching frequency and a target frequency and obtaining a frequency error from the difference therebetween in order to determine a search status. The method used by the frequency tracking unit to determine the search status is based on a pre-defined lock window and a cost window. When the frequency error is greater than the cost window, the search status is assigned as the coarse search status using the "Prune and Search" algorithm to search the target frequency; when the frequency error is greater than the lock window but smaller than the cost window, the search status is assigned as the fine search status using the "fixed-step" algorithm to search the target frequency; but when the frequency error is smaller than the locked window, the search status is assigned as the lock status and the output frequency is the desired target frequency.

PREFERRED EMBODIMENT

In the digital frequency synthesizer (DFS), according to the present invention, two major function blocks are identified, namely, a frequency controller and a ring-oscillator pair. Their functions are to search and control output clock to meet design specifications and then to generate target clocks, A default clock generated by the ring-oscillator pair is compared to an input reference clock for checking whether its frequency error is within a pre-defined lock window or not. If the frequency error is within the lock window, then the output frequency is the desired target frequency. Otherwise, the search continues until the target frequency is reached. As the search continues, the compared result is fed into the frequency controller to determine a new controlled status, or a frequency-search command to cause the ring-oscillator pair to update the output clock. The above-described procedures will be recycled until a target clock is synchronized to the input reference clock.

To ensure these search procedures are accurate and efficient, the frequency-search method adopted by the frequency controller includes two stages: one stage is the coarse search stage based on the "Prune-and-Search" algorithm in accordance with the disclosure in "Algorithmics: Theory and Practice," by G. Brassard and P. Bradley, Englewood Cliffs, N.J.: Prentice-Hall, 1998. The other stage is the fine search stage based on the "fixed-step" algorithm. In order to determine which search scheme is used to search the target frequency and to determine the lock status, two cost functions for search and lock-in are derived. These two cost functions define the search threshold and the lock threshold, and these thresholds define the cost window and the lock window. If the frequency error is higher than both the search and lock thresholds, a coarse search is activated to estimate the correct frequency. And only when the frequency error falls between the search and the lock thresholds, should the fine search be activated. By properly assigning these two thresholds, the search performance, such as timing and frequency error, and the output resolution can be improved.

DETAILED DESCRIPTION OF THE PREFERRED EMBODIMENT

Figure 1:
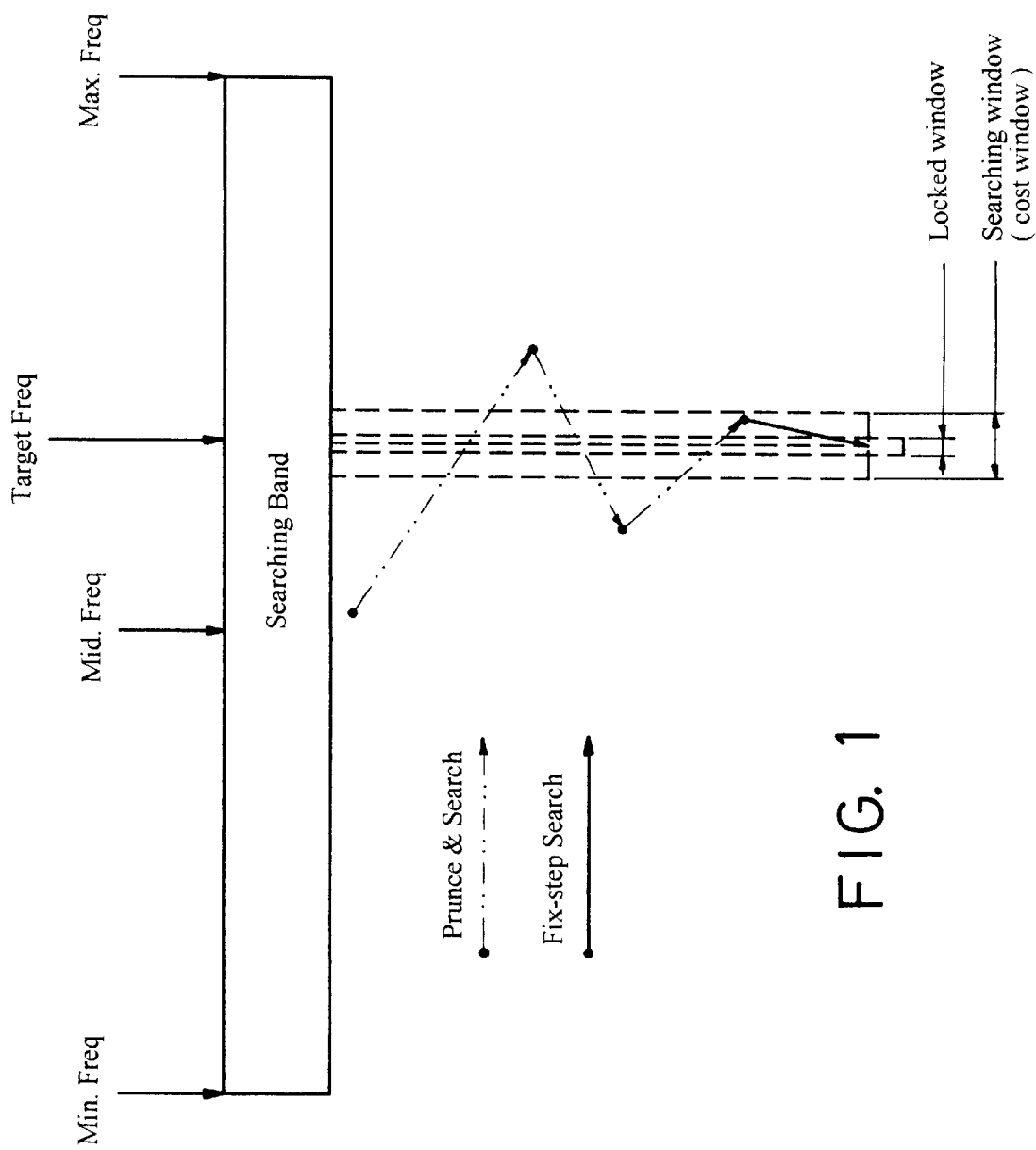
FIG. 1 illustrates the search flow.

FIG. 1 illustrates the search flow representing the method for searching a target frequency utilized in the present invention. It is assumed that a default frequency of the frequency synthesizer is set to Mid={(min. frequency+max. frequency)/2}. If the target frequency is higher than Mid and the frequency error is also greater than the both thresholds (i.e. falling outside of the cost window), then the default frequency must be increased, based on the "Prune-and-Search" scheme, from Mid to a new frequency given by {Mid+(max. frequency−min. frequency)/2}. If the frequency error is smaller than the search threshold but greater than the lock threshold (i.e. falling within the cost window), the search algorithm is switched to the "fixed-step" fine-tuning stage. Because the thresholds are fixed, the worst-case time complexity of fine search is a constant. Hence, the overall time complexity is given below:

$$T_n = T\left(\frac{n}{2}\right) + P(n) + F(n) \qquad (1)$$
$$= T\left(\frac{n}{2^k}\right) + k + C$$
$$= T(1) + \log_2 n + C$$
$$= O(\log_2 n)$$

It should be noted that Equation 1 is also applicable when the target frequency is lower than Mid.

Figure 2:
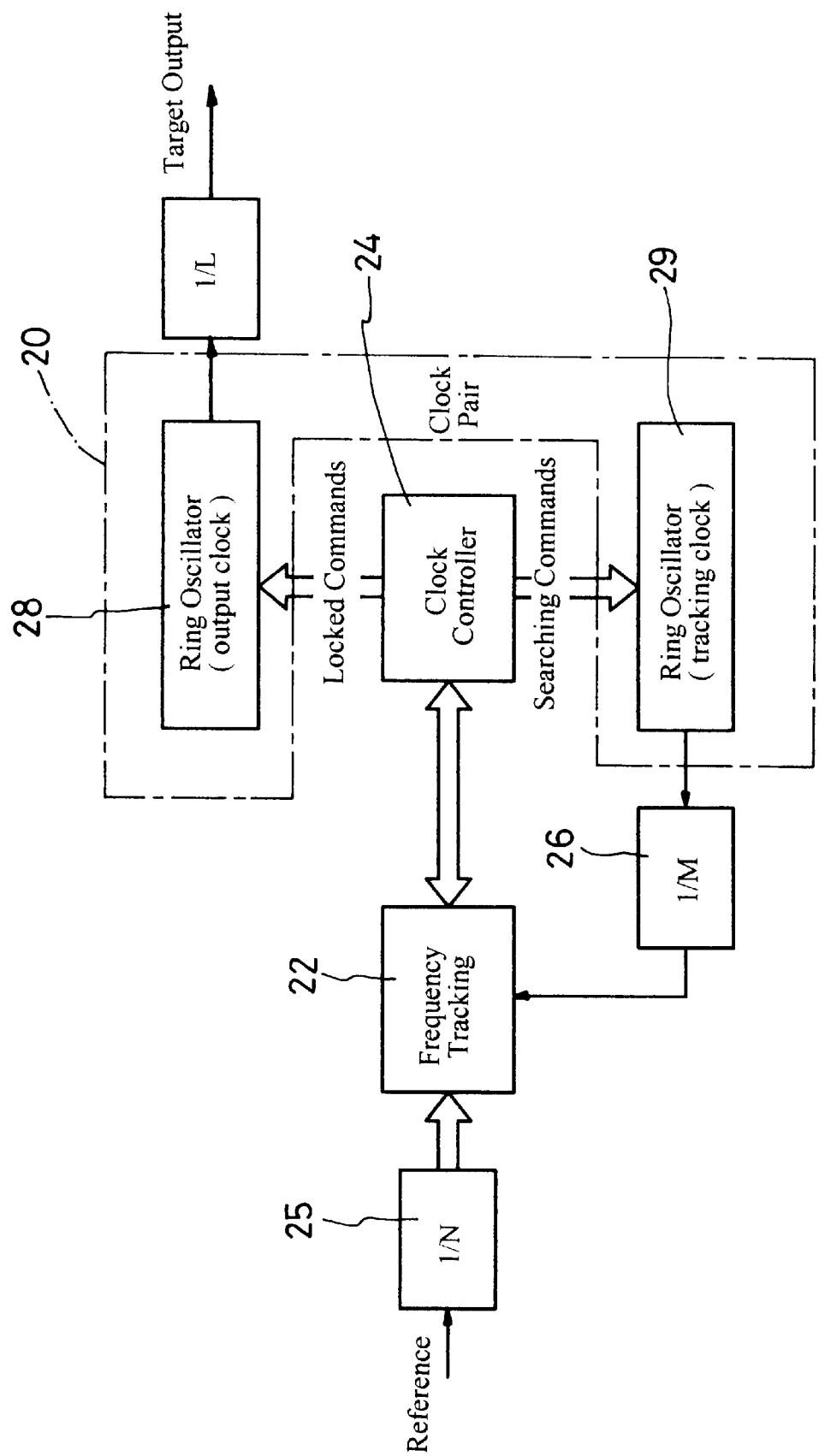
FIG. 2 is a block-diagram of the on-chip cell based DFS.

FIG. 2 is a block-diagram of the on-chip cell based DFS. On the surface, the DFS is similar to the traditional search loop designs. However, in the DFS in accordance with the present invention, an independent path has been added to generate target clocks. As can be seen from FIG. 2, the DFS is comprised of three function modules:

(1) a clock-pair 20 for generating clock source for search and output. The clock pair is comprised of an output clock ring-oscillator 28 for generating an output frequency, and a tracking clock ring-oscillator 29 for generating a tracking frequency;

(2) a frequency tracking unit 22 for searching a target frequency and determining the status of the clock pair 20; and (3) a clock controller 24 to decide the correct controlled timing during the changing of frequency search commands.

The architecture of the DFS, according to the present invention, looks like a conventional frequency synthesizer with an extra oscillator for generating target clock. In essence, the search mechanism of the DFS is completely different from the conventional frequency synthesizer.

In FIG. 2, the "divider N" 25 is used to adjust the reference frequency and to generate the controlled timing for frequency search. Since the propagation delays have to be taken in account, the overall operations are divided into two parts:

(1) an active region for searching a target frequency, and
(2) a preset region for restoring commands.

Due to the physical contraints of digital VLSI, such as setup time and hold time, the decisions of frequency search must be made carefully. In order to prevent timing violation, a "divider M'26 is used to enlarge the frequency error so that all the frequency errors can fit the timing requirements. In this way, the threshold can be accurately determined without timing violation. To compensate for temperature and supplied voltage variations, the search procedure is recycled even when a target clock is already found.

Figure 3:
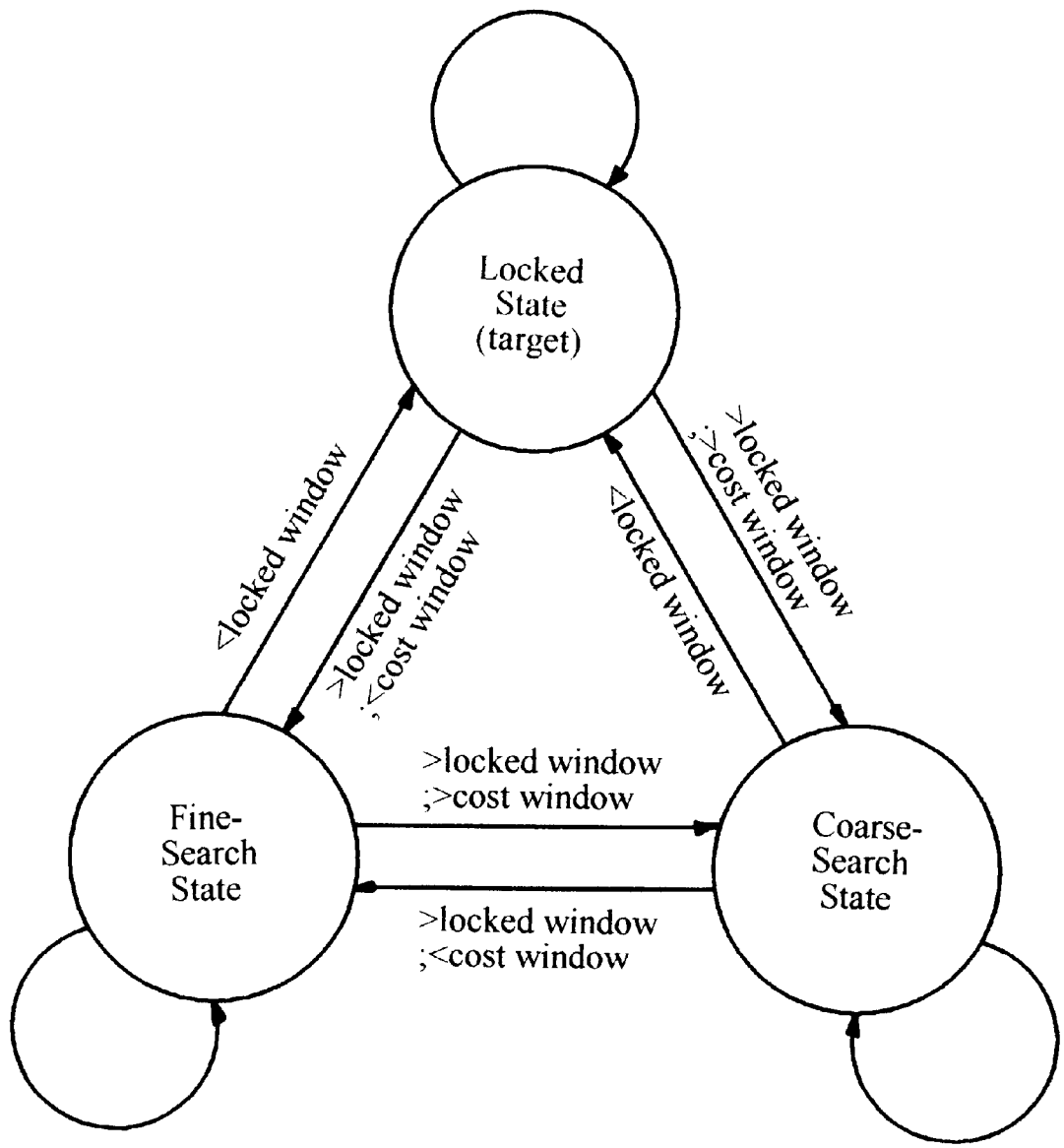
FIG. 3 is the status transition diagram of the frequency search.

FIG. 3 is the status transition diagram for the frequency search. As shown, when the search is in the coarse search stage, it will be switched to a fine search stage when the frequency error becomes greater than the lock window but smaller than the cost window; the search is switched to the lock status when the frequency error falls within the lock window. When the search is in the fine search stage, it will be switched to the lock status if the frequency error falls within the lock window; it will be switched back to the coarse search scheme if the frequency falls outside the cost window. It should be reminded that cost window is wider than the lock window.

Figure 4:
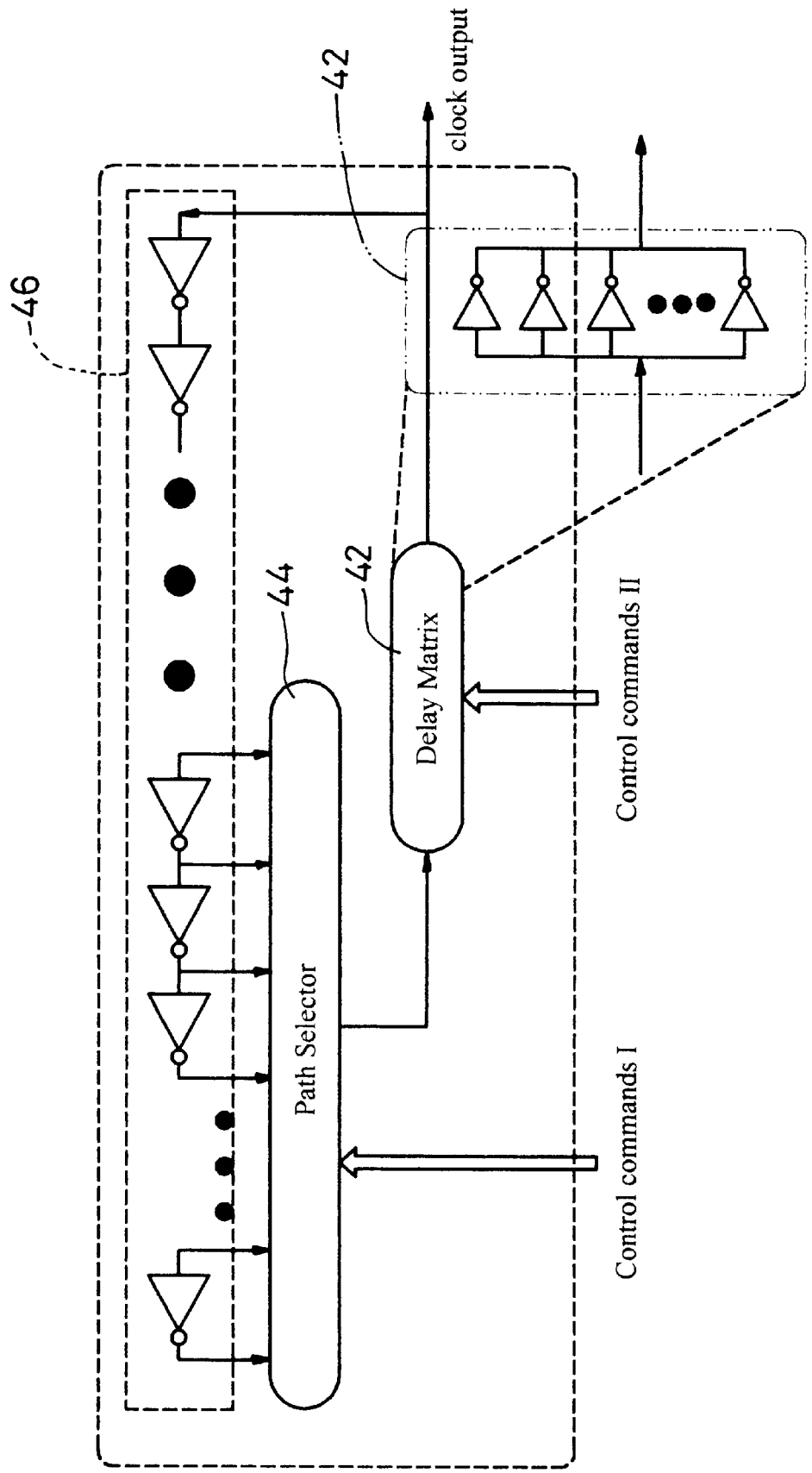
FIG. 4 shows a cell-based digital controlled oscillator.

FIG. 4 shows a cell-based digital controlled oscillator unit. The oscillator unit comprises mainly a ring-oscillator with multiple stages, whose characteristics are determined by the inverter chain 46. The free-running frequency of the oscillator unit is substantially determined by the number of operating inverters in the chain. It should be noted that the dynamic control range is determined by the path selector 44, and the frequency resolution is dependent on the scale of the parallel-inverter delay matrix 42. Both the path selector 44 and the delay matrix 42 are used to perform coarse and fine searches. The frequency resolution of the ring oscillators is determined by the minimum scale of the delay matrix. It should also be noted that there are two similar cell-based digital controlled oscillators within the clock pair: one oscillator is used for frequency search, while the other is used to generate the target clock.

The delay matrix 42 in FIG. 4 can be analyzed by the RC-delay model. With such model, the frequency resolution for the m-th delay path can be expressed by $$\Delta\tau(K, m) = \frac{RC_{ox}}{2} \frac{K+1}{m(m+1)} \quad (K > m) \qquad (2)$$

where R is the output resistance, $C_{ox}$ is the gate capacitance, W and L are the MOS width and the channel length, respectively, and K is the total number of paths in the delay matrix. Hence, the delay matrix 42 owns a total of K paths each with a different delay to pass signals. By properly assigning the value of K and m in Equation 2, a linear delay model can be obtained. The delay time model of a 0.6 um CMOS SPTM cell library is shown in FIG. 5

Figure 5:
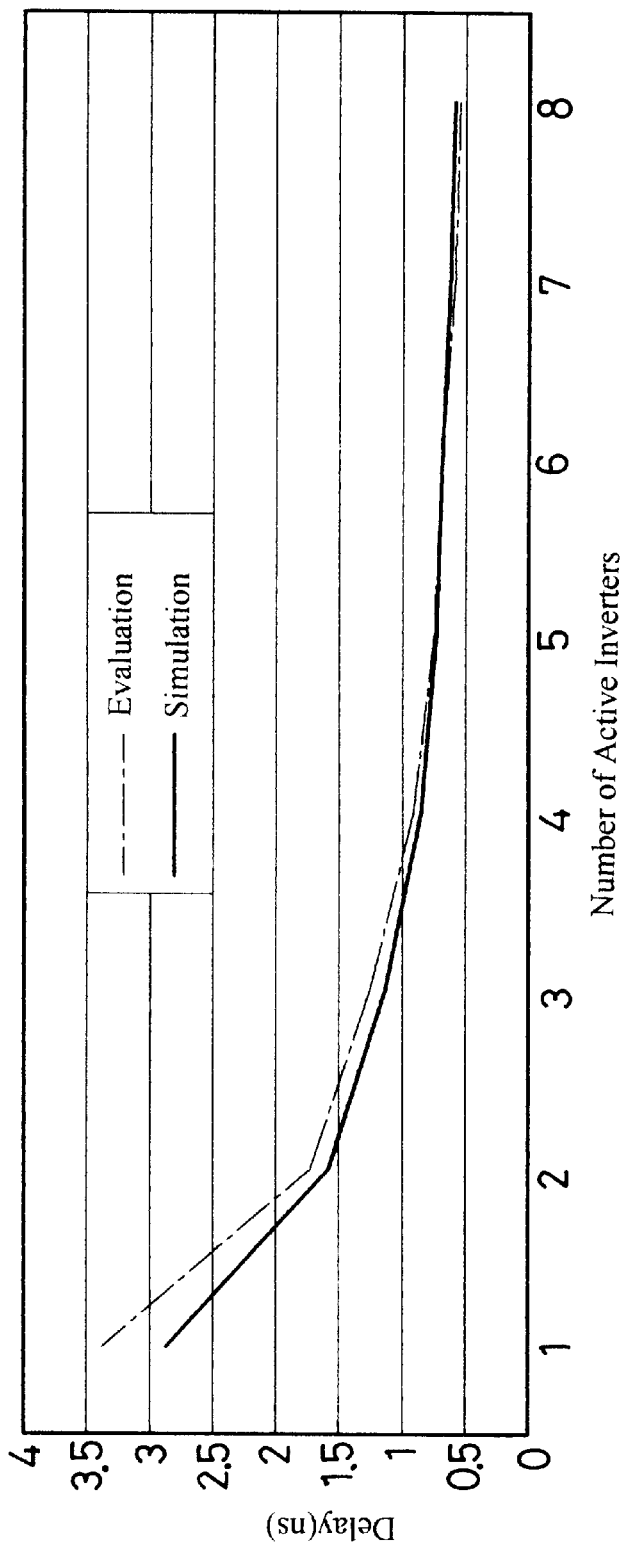
FIG. 5 shows the relationship between the delay time and the number of operating inverters.

FIG. 5 shows the relationship between the delay time and the number of operating inverters in the delay matrix. In FIG. 5, both the estimated delay time derived from theory and the delay time obtained by simulation are shown for comparison.

To ensure that the DFS architecture as shown in FIG. 2 and FIG. 4 can generate any desirable target frequency, both temperature and voltage variations must be taken into account. According to the disclosure in "CMOS Digital Integrated Circuits: Analogs & Design" by S. M. Kang and Y. Leblebici, New York: McGraw-Hill, 1996, the output frequency of an inverter chain is dependent on $\tau_{PHL}$ and $\tau_{PLH}$ of the inverters. But the inverter delays are also affected by temperature, supplied voltage, loading capacitance, and so forth. For simplification without losing generality, it is assumed that $V_{TN}=|V_{TP}|=V_T$ and $k_n=k_p$ for $\tau_{PHL}=\tau_{PLH}$. In addition, a certain frequency error, denoted by $\Delta f$, is allowed. Thus, when the output frequency is equal to $f_{target}\pm\Delta f$, the size of the lock window must be smaller than the frequency error to produce the target frequency. The output frequency of the cell-based digital controlled oscillator is given by:

$$f_{target} = \frac{1}{\tau_{target}} \qquad (3)$$

$$\tau_{target} = 2\left[n \cdot \tau_{PHL}\left(\tau_{PHL} + \frac{\tau_{PHL}}{K} \cdot m\right)\right] + C \qquad (4)$$

and C is a constant for a free-running frequency; n is the total number of inverters; $[\tau_{PHL}+\tau_{PHL}K\cdot m]$ is the model of the delay matrix representing the delay of the m-th path in total K delay paths. Note that Equation (4) must satisfy the inequality of frequency errors:

$$\frac{1}{f_{target} + \Delta f} \le \left[n \cdot \tau_{PHL} + \left(\tau_{PHL} + \frac{\tau_{PHL}}{K} \cdot m\right)\right] + C \le \frac{1}{f_{target} - \Delta f} \qquad (5)$$

In Equation (5), for any given $\Delta f \neq 0$ and $\tau_{PHL}$, we can find a·K to satisfy the inequality of frequency errors. The larger a dynamic range of n is, the wider an output bandwidth will be resulted. If K is increased, the resolution of the cell-based oscillators can be improved. Both the n and m parameters are controlled by the frequency-tracking module to search proper assignment based on both "Prune-and-Search" and the "fixed-step" algorithms.

A cell-based DSSS baseband transceiver chip with on-chip DFS has been designed and successfully fabricated in the 0.6 um CMOS SPTM process. The whole system is first described by synthesizable Verilog-HDL to meet system behaviors. The Verilog source-codes are synthesized to meet further specifications and to generate gate-level netlists based on a target standard-cell library for further simulations and verifications. The total gate count of the DFS is about 2200 and its area is equal to $1893\times802\ \mu m^2$. The test results for N=8, M=24 and L=2 show that the on-chip DFS can generate frequencies ranging substantially from 66 MHz to 165 MHz with less than ±60 ps jitter and operate at a minimum supplied voltage of 2.4V.

In summary, the digital frequency synthesizer, according to the present invention, is comprised of:

a clock pair having two similar ring-oscillators, one is for generating an output frequency and the other is for generating a search frequency;

a first divider for generating an adjusted reference frequency based on an input reference frequency; and a second divider for generating an adjusted search frequency based on the search frequency from the clock pair;

a frequency tracking unit, based on the adjusted reference frequency and the adjusted search frequency, for deciding a search status; the status is determined by the frequency error obtained from comparing the adjusted search frequency with a target frequency; and a clock controlling unit connected to the frequency tracking unit and the clock pair for generating a control command based on said search status. The control command is used to cause the clock pair to adjust the frequency produced thereby and to determine the correct controlled timing during the changing of control commands.

In the digital frequency synthesizer, a pre-defined lock window and a cost window are used for the frequency tracking unit to determine the search status. The lock window is smaller than the cost window. The frequency tracking unit determines the search status based on the magnitude of frequency error in relation to the cost and lock windows:

when said frequency error is greater than the cost window, a coarse search based on the Prune-and-Search" algorithm is used to search the target frequency; when frequency error is greater than said lock window but smaller than said cost window; a fine search based on the "fixed-step" algorithm is used to search the target frequency; and when the frequency error is smaller than the lock window, the desired target frequency is considered found and the search status is switched to a locked status.

In the afore-described digital frequency synthesizer, the first divider is connected to the frequency tracking unit for providing an adjusted reference frequency based on the input reference frequency. The first divider also generates the controlled timing required by the frequency tracking unit. The second divider is connected to the frequency tracking unit and the ring-oscillator that produces search frequencies. It is used to adjust the search frequency and to convey the adjusted search frequency to the frequency tracking unit for obtaining a new frequency error. The second divider also enlarges the new frequency error so that all frequency errors fit the timing requirements.

Each of the ring-oscillators of the clock pair is comprised of a serial inverter chain for generating a free-running frequency, wherein each of the inverters can be selectively caused to become operating or non-operating; a path selector is connected to the serial inverter chain and the clock controlling unit to receive a control command for changing the number of the operating inverters. The path selector is also used for outputting the frequency generating by the serial inverter chain. Each ring-oscillator also includes a delay matrix connected to the serial inverter chain, the path selector and the clock controlling unit. The delay matrix is used to delay the output frequency received from the path selector, responsive to the control command. The delay matrix also feeds the delayed signal back to the serial-inverter chain. The delay matrix is comprised of a parallel inverter chain in which each of the parallel-inverters can be selectively caused to become operating or non-operating. The delay time can be altered by changing the number of operating parallel-inverters.

Preferably, the digital frequency synthesizer is designed at HDL level and synthesized for a target cell library.

While the present invention has been disclosed in reference to the preferred embodiment, it shall be understood by those skilled in the art that various changes, modifications and substitutions may be incorporated into such embodiments without departing from the spirit of the invention as defined by the claims appearing hereafter.

What is claimed is:

1. A digital frequency synthesizer comprising:

a clock pair having a first ring-oscillator for generating an output frequency, and a second ring-oscillator for generating a search frequency;

a frequency tracking unit for comparing said search frequency with a target frequency to obtain from the difference therebetween a frequency error, said frequency tracking unit further deciding a search status; and a clock controlling unit connected to said frequency tracking unit and said clock pair for generating a control command based on said search status so as to command said clock pair to adjust the frequency produced thereby, and to determine a correct controlled timing during changing of the control command.

2. The digital frequency synthesizer of claim 1 further comprising a first divider receiving a first reference frequency and adjusting said first reference frequency to become a second reference frequency; said first divider connected to said frequency tracking unit and conveying thereto the second reference frequency; said first divider further generating a controlled timing required by said frequency tracking unit.

3. The digital frequency synthesizer of claim 2 further comprising a second divider connected to said second ring-oscillator and said frequency tracking unit for adjusting said search frequency and outputting the adjusted search frequency to said frequency tracking unit to obtain a new frequency error, said second divider further enlarging the new frequency error so as to fit the new frequency error to the timing requirements.

4. The digital frequency synthesizer of claim 1, wherein each of the first and second ring-oscillators in said clock pair comprises:

a first inverter chain including a plurality of inverters being connected in serial for generating a free-running frequency, wherein each of said serial-inverters can be selectively caused to become operating or non-operating;

a path selector connected to said first inverter chain and said clock controlling unit for receiving said control command so as to alter the number of the operating inverters in said first inverter chain, said path selector further outputting the frequency generated by said first inverter chain; and a delay matrix connected to said first inverter chain, said path selector and said clock controlling unit, receiving a signal containing the frequency from said path selector, said delay matrix causing a delay of said signal by a delay time responsive to said control command, said delay matrix further feeding the delayed signal back to said first inverter chain.

5. The digital frequency synthesizer of claim 4, wherein said delay matrix comprises a second inverter chain having a plurality of inverters connected in parallel, wherein each of said parallel-inverters is selectively caused to become operating or non-operating and the number of operating second inverters is altered to change the delay time.

6. The digital frequency synthesizer as claimed in claim 1 being designed at HDL level and synthesized for a target cell library.

7. A method of digitally synthesizing frequency comprising the steps of:

defining a lock window and a cost window, wherein said cost window is wider than said lock window;

generating an output frequency and a search frequency using a pair of ring-oscillators;

comparing a search frequency and a target frequency to obtain a frequency error based on a reference frequency;

causing a search status to become a coarse search status when said frequency error is greater than said cost window, causing said search status to become a fine search status when said frequency error is greater than said lock window but smaller than said cost window;

causing said search status to become a lock status when said frequency error is smaller than said lock window; and based on the search status, generating a control command for controlling said ring-oscillators to increase or decrease the frequency generated by said ring-oscillators in order to search the target frequency.

* * * * *